United States Patent
Tsai et al.

(10) Patent No.: US 9,634,682 B1
(45) Date of Patent: Apr. 25, 2017

(54) ANALOG-TO-DIGITAL CONVERTING MODULE FOR RELATED LIGHT SENSING DEVICE

(71) Applicant: SensorTek technology Corp., Hsinchu County (TW)

(72) Inventors: Tso-Sheng Tsai, Hsinchu County (TW); Jer-Hau Hsu, Hsinchu County (TW); Wen-Cheng Chen, Hsinchu County (TW); Ming-Huang Liu, Hsinchu County (TW)

(73) Assignee: SensorTek technology Corp., Hsinchu County (TW)

( * ) Notice: Subject to any disclaimer, the term of this patent is extended or adjusted under 35 U.S.C. 154(b) by 0 days.

(21) Appl. No.: 15/050,479

(22) Filed: Feb. 23, 2016

(30) Foreign Application Priority Data

Jan. 26, 2016 (TW) .............................. 105102302 A

(51) Int. Cl.
*H03M 1/12* (2006.01)
*H03M 1/10* (2006.01)
*H03M 1/38* (2006.01)
*G01J 1/44* (2006.01)

(52) U.S. Cl.
CPC ............. *H03M 1/1038* (2013.01); *G01J 1/44* (2013.01); *H03M 1/38* (2013.01); *G01J 2001/4413* (2013.01)

(58) Field of Classification Search
CPC ........ H03M 1/1038; H03M 1/38; H03M 1/12; H03M 1/00; H03M 2201/192; H03M 2201/51; G01J 1/44

USPC .................................................. 341/155, 156
See application file for complete search history.

(56) References Cited

U.S. PATENT DOCUMENTS

| | | | | |
|---|---|---|---|---|
| 5,519,397 A | * | 5/1996 | Chapotot | G01D 3/02 340/450.2 |
| 6,774,740 B1 | * | 8/2004 | Groe | H03C 3/0925 332/103 |
| 6,956,417 B2 | * | 10/2005 | Bernstein | H03L 7/093 327/157 |
| 7,486,386 B1 | | 2/2009 | Holcombe | |
| 7,960,997 B2 | * | 6/2011 | Williams | H01L 23/49575 324/762.09 |
| 8,749,222 B2 | * | 6/2014 | Williams | H01L 23/49575 324/76.11 |

(Continued)

*Primary Examiner* — Jean B Jeanglaude
(74) *Attorney, Agent, or Firm* — Winston Hsu; Scott Margo

(57) ABSTRACT

An analog-to-digital module includes a sampling unit, for generating an output voltage between a positive output end and a negative output end according to a positive input voltage of a positive input end and a negative input voltage of a negative input end; a comparing unit, for generating a digital output signal according to magnitude relationship between the output voltage and a reference voltage; a variable current source, for generating a variable current according to the digital output signal at the negative input end in a first period according to a control signal; a measured current source, for generating a measured current at the negative input end; and an adjusting unit, for adjusting the output voltage according to the digital output signal in a second period according to the control signal; wherein the first period does not overlap the second period.

16 Claims, 6 Drawing Sheets

(56) References Cited

U.S. PATENT DOCUMENTS

| | | | |
|---|---|---|---|
| 8,878,555 B2* | 11/2014 | Huang | G06F 3/044 |
| | | | 324/678 |
| 9,175,279 B1* | 11/2015 | Michel | C12N 9/6437 |
| 2013/0162269 A1* | 6/2013 | Julicher | G01R 19/25 |
| | | | 324/658 |

* cited by examiner

ANALOG-TO-DIGITAL CONVERTING MODULE FOR RELATED LIGHT SENSING DEVICE

BACKGROUND OF THE INVENTION

1. Field of the Invention

The present invention relates to an analog-to-digital converting module for a light sensing device and related sensing device, and more particularly, to an analog-to-digital converting device with different operation modes and related sensing device.

2. Description of the Prior Art

The light sensing technology is widely used in many applications. For example, the ambient light sensor (ALS) is applied to the laptop computer and the cell phone to sense the intensity of the ambient light and automatically adjusts the backlight of the liquid crystal display (LCD) screen. The usage convenience is improved and the battery life is prolonged, therefore. The light sensor also can be utilized to measure the distance or location of an object. For example, the mobile device generally comprises the proximity sensor. Conventionally, the proximity sensor can be realized by various methods. For example, the types of the proximity sensor comprise the inductive sensor, the capacitive sensor, the magnetic sensor and the photoelectric sensor. Note that, the photoelectric sensor has gained popularity in recent years. In addition, other important applications of the light sensing technology, such as object presence detection and gesture recognition, also draw lots of attentions.

Generally, the light sensor needs an analog-to-digital converter to convert the analog voltage generated by sensing light to a digital signal processed by the digital circuits. In addition, the light sensor needs another analog-to-digital converter to calibrate the environment noise and to eliminate the effects of the environment noises. Because the specifications of the analog-to-digital converter for converting the analog voltage are different from those of the analog-to-digital converter for calibration environment noises, the light sensor use different analog-to-digital converters to convert the analog voltage and the environment noise. That is, at least two analog-to-digital converters are needed for realizing the light sensor. The manufacture cost of the light sensor increases, therefore. As can be seen from the above, the prior art needs to be improved.

SUMMARY OF THE INVENTION

In order to solve the above problem, the present invention provides an analog-to-digital converting device with different operation modes and related sensing device.

The present invention discloses an analog-to-digital module. The analog-to-digital converting module comprises a sampling unit, for generating an output voltage between a positive output end and a negative output end according to a positive input voltage of a positive input end and a negative input voltage of a negative input end; a comparing unit, for generating a digital output signal according to magnitude relationship between the output voltage and a reference voltage; a variable current source, for generating a variable current according to the digital output signal at the negative input end in a first period according to a control signal; a measured current source, for generating a measured current at the negative input end; and an adjusting unit, for adjusting the output voltage according to the digital output signal in a second period according to the control signal; wherein the first period does not overlap the second period.

The present invention further discloses a sensing device. The sensing device comprises a light emitting module, for generate light of a predefined frequency range according to temperature sensing information; an analog-to-digital converting module, comprising a sampling unit, for generating an output voltage between a positive output end and a negative output end according to a positive input voltage of a positive input end and a negative input voltage of a negative input end; a comparing unit, for generating a digital output signal according to magnitude relationship between the output voltage and a reference voltage; a variable current source, for generating a variable current according to the digital output signal at the negative input end in a first period according to a control signal; an adjusting unit, for adjusting the output voltage according to the digital output signal in a second period according to the control signal; a sensing unit, for sensing the light of the predefined frequency range to generate a sensing current; a temperature sensing unit, for generating a temperature sensing current proportional to the absolute temperature; and a switch unit, for conducting a connection between the temperature sensing unit and the negative input end in the first period and conducting another connection between the sensing unit and the negative input end in the second period; and a process unit, for generating the control signal, generating the temperature sensing information according to the digital output signal in the first period, and generating a light sensing information according to the digital output signal in the second period; wherein the first period does not overlap the second period.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
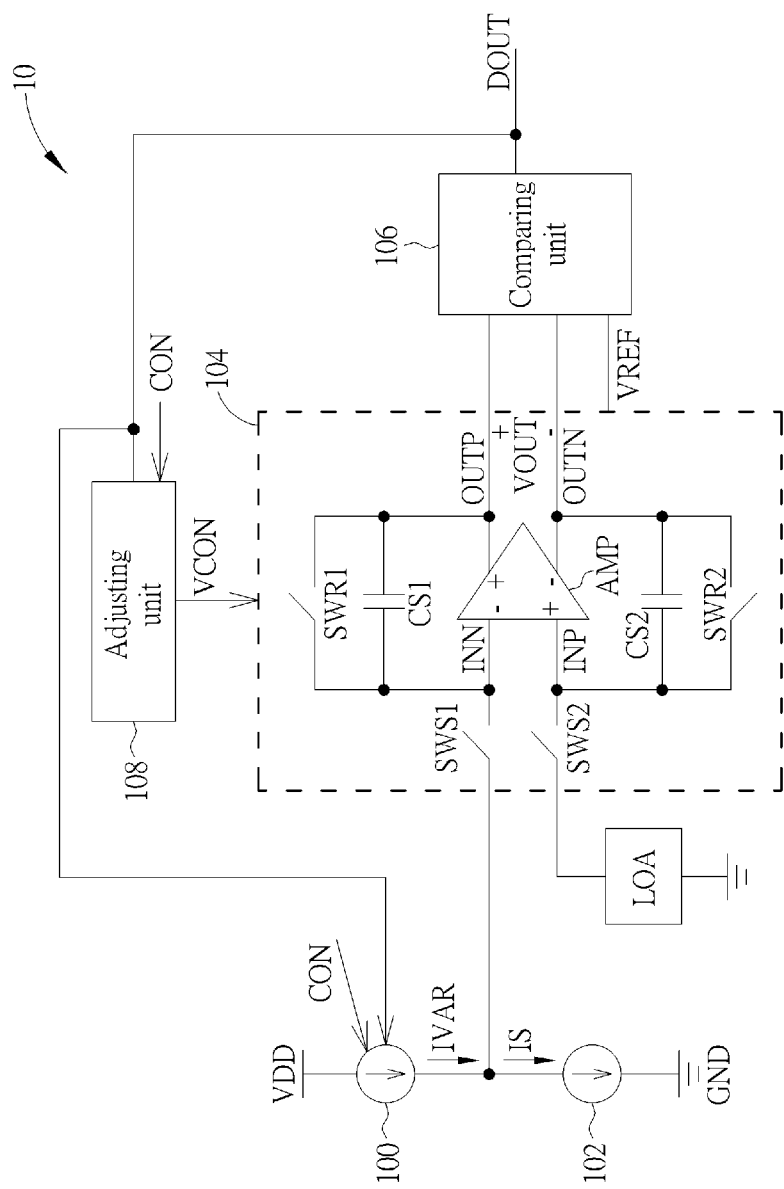
FIG. 1 is a schematic diagram of an analog-to-digital converting module according to an example of the present invention.

Please refer to FIG. 1, which is a schematic diagram of an analog-to-digital converting module 10 according to an example of the present invention. The analog-to-digital converting module 10 may be utilized in a light sensing device. In an example, the light sensing device is a time of flight range sensor, and is not limited herein. As show in FIG. 1, the analog-to-digital converting module 10 comprises a variable current source 100, a measured current source 102, a sampling unit 104, a comparing unit 106 and an adjusting unit 108. The variable current source 100 and the measured current 102 are coupled to a negative input end INN and respectively generate a variable current IVAR and a measured current IS to the negative input end INN. The sampling unit 104 is utilized to generate an output voltage VOUT at output ends OUTP and OUTN according to a voltage VINN of the negative input end INN and a voltage VINP of a positive input end INP. The comparing unit 106 is utilized to generate a digital output signal DOUT according to the magnitude relationship between the output voltage VOUT and a reference voltage VREF. According to a control signal CON, the variable current source 100 generates the variable current IVAR to the negative input end INN according to the output signal DOUT in a period TP1; or the adjusting unit 108 adjusts the output voltage VOUT according to the digital output signal DOUT in a period TP2. Note that, the period TP1 does not overlap the period TP2, to make the analog-to digital converting module 10 operate in different operation modes in different periods. Via adjusting the control signal CON, the analog-to-digital converting module 10 adopts different operation modes to convert the measured current IS.

In the period TP1, the variable current source 100 adjusts the variable current IVAR according to the digital output signal DOUT to make the analog-to-digital converting module 10 operates in a successive approximation analog-to-digital converting mode. In an example, the measure current source 102 is a proportional to absolute temperature (PTAT) current source and is utilized to generate the measured current IS used as a reference of temperature calibration. The sampling unit 104 comprises sampling switches SWS1, SWS2, reset switches SWR1, SWR2, sampling capacitors CS1, CS2, and an operational amplifier AMP. Via alternately switching the sampling switches SWS1, SWS2 and the reset switches SWR1 and SWR2, the sampling unit 104 realizes an integrator function, to generate the voltage VOUTP and VOUTN of the output ends OUTP and OUTN according to the voltage VINP of the positive input end INP and the voltage VINN of the negative input end INN, wherein the output voltage VOUT is the voltage difference between the voltages VOUTP and VOUTN. The operation principles of utilizing the sampling switches SWS1, SWS2, reset switches SWR1, SWR2, sampling capacitors CS1, CS2 and the operational amplifier AMP to realize the integrator function should be well known to those with ordinary skill in the art, and are not narrated herein for brevity. The positive input end INP couples to a loading unit LOA, to match the loadings of the negative input end INN. According to different applications and design concepts, the loading unit LOA may be omitted. The comparing unit 106 comprises at least one comparator and is utilized to generate the digital output signal DOUT with n bits according to the magnitude relationship between the output voltage VOUT (i.e. the voltage difference between the voltages VOUTP and VOUTN) and the reference voltage VREF. Note that, the reference voltage VREF also can be inputted to the comparing unit by the differential input method. When the analog-to-digital converting module 10 operates in the successive approximation analog-to-digital converting mode, the adjusting unit 108 stops operating according to the control signal CON. Under such a condition, the operation principles of the analog-to-digital converting module 10 are similar to those of a successive approximation register analog-to-digital converter.

As to detailed operations of the analog-to-digital converting module 10 in the period TP1 please refer to the following. When the analog-to-digital converting module 10 begins to operate in the successive approximation analog-to-digital converting mode, the current value of the variable current IVAR outputted by the variable current 100 is IREF. The sampling unit 104 samples the voltage VINP of the positive input end INP and the voltage VINN of the negative input end INN as the voltages VOUTP and VOUTN of the output ends OUTP and OUTN, respectively. The voltage VINN of the negative input end INN relates to the difference between the current value IREF of the variable current IVAR and that of the measured current IS. The output voltage VOUT is the difference between the voltages VOUTP and VOUTN (i.e. VOUT=VOUTP−VOUTN=VINP−VINN). The comparing unit 106 generates the most significant bit (i.e. $n^{th}$ bit) of the digital output signal DOUT. When the voltage VOUT is greater than the reference voltage VREF, the comparing unit 106 adjusts the $n^{th}$ bit of the digital output signal DOUT to a high logic level (i.e. '1'); and when the voltage VOUT is smaller than the reference voltage VREF, the comparing unit 106 adjusts the $n^{th}$ bit of the digital output signal DOUT to a low logic level (i.e. '0').

Next, the variable current source 100 adjusts the current value of the variable current IVAR according to the $n^{th}$ bit of the digital output signal DOUT. When the nth bit of the digital output signal DOUT is '1', the variable current source 100 keeps the current value of the variable current IVAR at IREF; and when the $n^{th}$ bit of the digital output signal DOUT is '0', the variable current source 100 subtracts IREF from the current value of the variable current IVAR. Before the sampling unit 104 performs the second sampling process, the variable current source 100 increases the current value of the variable current IVAR by $2^{-1}$*IREF. According to the adjusted variable current IVAR, the sampling unit 104 performs the sampling process again to generate the output voltage VOUT. The comparing unit 106 generates the $(n-1)^{th}$ bit of the digital output signal DOUT according to the relationship between the output voltage OUT and the reference voltage VREF.

The variable current source 100 adjusts the current value of the variable current IVAR according to the $(n-1)^{th}$ bit of the digital output signal DOUT. When the $(n-1)^{th}$ bit of the digital output signal DOUT is '1', the variable current source 100 keeps the current value of the variable current IVAR the same; and when the $(n-1)^{th}$ bit of the digital output signal DOUT is '0', the variable current source 100 subtracts $2^{-1}$*IREF from the current value of the variable current IVAR. Before the sampling unit 104 performs the third sampling process, the variable current source 100 increases the current value of the variable current IVAR by $2^{-2}$*IREF. According to the adjusted variable current IVAR, the sampling unit 104 performs the sampling process again to generate the output voltage VOUT. The comparing unit 106 generates the $(n-2)^{th}$ bit of the digital output signal DOUT according to the relationship between the output voltage OUT and the reference voltage VREF, and so on.

In the period TP2, the adjusting unit 108 adjusts the output voltage VOUT according to the digital output signal DOUT, to make the analog-to-digital converting module 10 operates in a cyclic analog-to-digital converting mode. In this example, the variable current source 100 stops operating according to the control signal CON. The measured current source 102 may be a photo diode and is used for sensing light of a specific frequency range to generate the measured current IS. The sampling unit 104 comprises the sampling switches SWS1, SWS2, the reset switches SWR1, SWR2, the sampling capacitors CS1, CS2, and the operational amplifier AMP. Via alternately switching the sampling switches SWS1, SWS2 and the reset switches SWR1 and SWR2, the sampling unit 104 realizes the integrator function, to generate the voltage VOUTP and VOUTN of the output ends OUTP and OUTN according to the voltage VINP of the positive input end INP and the voltage VINN of the negative input end INN, wherein the output voltage VOUT is the voltage difference between the voltages VOUTP and VOUTN. The positive input end INP couples to the loading unit LOA to match the loadings of the negative input end INN. The comparing unit 106 comprises at least one comparator and is utilized to generate the digital output signal DOUT with m bits according to the magnitude relationship between the output voltage VOUT and the reference voltage VREF. The adjusting unit 108 may be a multiplying digital-to-analog convertor (MDAC) and is utilized to adjust the output voltage VOUT via a voltage control signal VCON. In an example, the adjusting unit 108 changes the output voltage VOUT by adjusting the voltage VINN of the negative input end INN and the voltage VINP of the positive input end INP. Under such a condition, the operation principles of the analog-to-digital converting module 10 are similar to those of a cyclic analog-to-digital converter.

As to the detailed operations of the analog-to-digital converting module 10 in the period TP2, please refer to the followings. When the analog-to-digital converting module 10 starts operating in the cyclic analog-to-digital converting mode, the sampling unit 104 samples the voltage VINP of the positive input end INP and the voltage VINN of the negative input end INN as the voltages VOUTP and VOUTN of the output ends OUTP and OUTN, respectively. The voltage VINN of the negative input end INN relates to the current value of the measured current IS. The output voltage VOUT is the difference between the voltages VOUTP and VOUTN. The comparing unit 106 generates the most significant bit (i.e. $m^{th}$ bit) of the digital output signal DOUT. When the voltage VOUT is greater than the reference voltage VREF, the comparing unit 106 adjusts the $m^{th}$ bit of the digital output signal DOUT to '1'; and when the voltage VOUT is smaller than the reference voltage VREF, the comparing unit 106 adjusts the $m^{th}$ bit of the digital output signal DOUT to '0'.

Based on the $m^{th}$ bit of the digital output signal DOUT, the adjusting unit 108 uses different methods to adjust the output voltage VOUT. When the $m^{th}$ bit of the digital output signal DOUT is '1', the adjusting unit 108 subtracts the reference voltage VREF from the output voltage VOUT, via a voltage control signal VCON, and the acquired difference is multiplied by 2 (i.e. VOUT=2*(VOUT−VREF)). When the $m^{th}$ bit of the digital output signal DOUT is '0', the output voltage VOUT is multiplied by 2, via the voltage control signal VCON (i.e. VOUT=2*VOUT). After the adjusting unit 108 adjusts the output voltage VOUT according to the $m^{th}$ bit of the digital output signal DOUR, the comparing unit 106 generate the $(m-1)^{th}$ bit of the digital output signal DOUT according to the relationship between the output voltage VOUT and the reference voltage VREF and the adjusting unit 108 adjusts the output voltage VOUT according to the $(m-1)^{th}$ bit of the digital output signal DOUT. Via repeating the above processes, the comparing unit 106 sequentially generates all of the bits of the digital output signal DOUT.

The analog-to-digital converting module 10 operates in different operation modes when adjusting the variable current IVAR or adjusting the output voltage VOUT according digital output signal DOUT, to use different converting methods to convert the measured current IS to the digital output signal DOUT. In other words, the present invention utilizes the same circuit components to realize the analog-to-digital converting module equipping with different converting methods. According to the type of the measured signal and the required output specifications, the disclosed analog-to-digital converting module is able to select appropriate converting method to convert the measured signal. Further, the number of the analog-to-digital converting module for implementing the same circuits is reduced when adopting the disclosed analog-to-digital converting module. The manufacture cost of the circuit is decreased, therefore.

Figure 2:
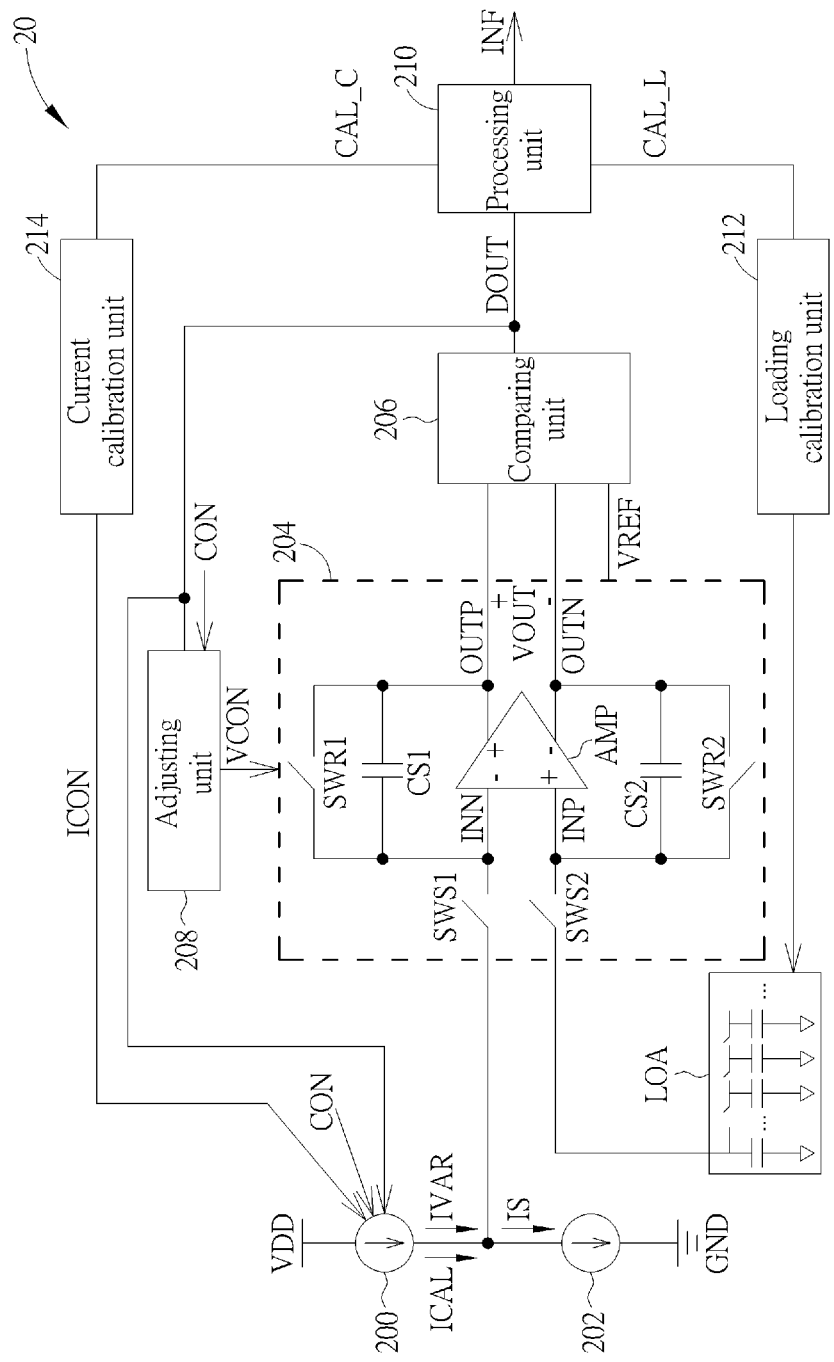
FIG. 2 is a schematic diagram of another analog-to-digital converting module according to an example of the present invention.

According to difference applications and design concepts, those with ordinary skill in the art may observe appropriate alternations and modifications. Please refer to FIG. 2, which is a schematic diagram of an analog-to-digital converting module 20 according to an example of the present invention. The analog-to-digital converting module 20 may be utilized in a light sensing device, and is not limited herein. The analog-to-digital converting module 20 is similar to the analog-to-digital converting module 10, thus the components and signals with similar functions use the same symbols. Different from the analog-to-digital converting module 10, the analog-to-digital converting module 20 further comprises a processing unit 210, a loading calibration unit 212 and a current calibration unit 214. The processing unit 210 may be a digital signal processor (DSP) and is utilized to generate sensing information INF, a loading calibration signal CAL_L and a current calibration signal CAL_C according to the digital output signal DOUT. The loading calibration unit 212 adjusts the loading of the loading unit LOA according to the loading calibration signal CAL_L, to match the loading of the positive input end INP and that of the negative input end INN. In this example, the loading unit LOA comprises a plurality of parallel connected capacitors. According to the loading calibration signal CAL_L, the loading adjusting unit 212 adjusts the number of capacitors coupled to the positive input end INP. According to the current calibration signal CAL_C, the current calibration unit 212 controls the variable current source 200, via the current control signal ICON, to generate a calibration current ICAL to the negative input end INN, to eliminate the non-ideal effects of the measured current source 202. When the analog-to-digital converting module 20 operates in the cyclic analog-to-digital converting mode or the successive approximation analog-to-digital converting mode, the variable current source 200 generates the calibration current ICAL to improve the resolution of the analog-to-digital converting module 20.

Figure 3:
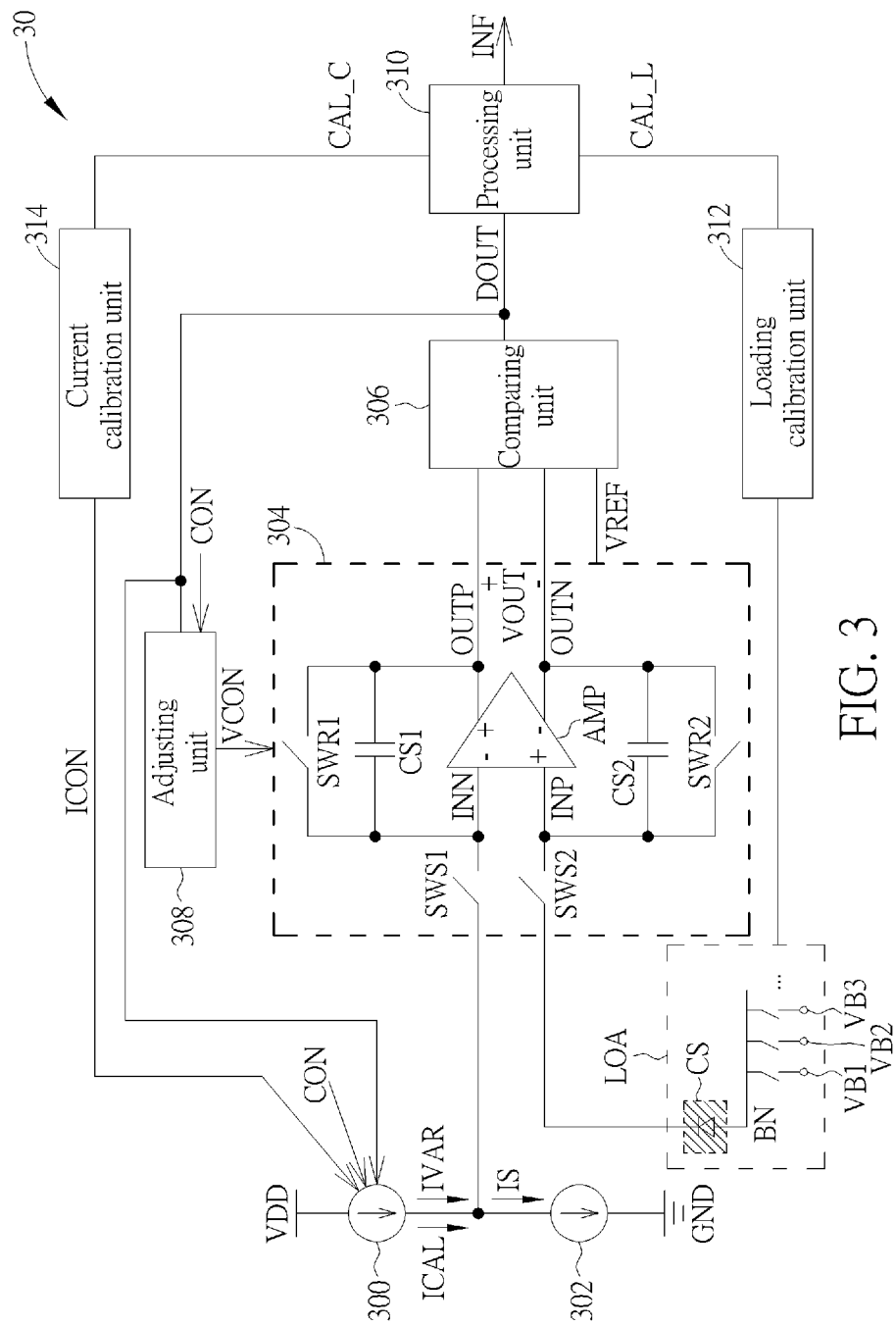
FIG. 3 is a schematic diagram of another analog-to-digital converting module according to an example of the present invention.

Please refer to FIG. 3, which is a schematic diagram of an analog-to-digital converting module 30 according to an example of the present invention. The analog-to-digital converting module 30 may be utilized in a light sensing device, and is not limited herein. The analog-to-digital converting module 30 is similar to the analog-to-digital converting module 20, thus the components and signals with similar functions use the same symbols. In this example, the loading unit LOA is realized by a current source CS coupled between the positive input end INP and a biasing end BN. In an example, the current source CS is a photo diode that does not sense the ambient light when the current source 302 is the photo diode used for sensing the ambient light. According to the loading calibration signal CAL_L, the loading calibration unit 312 adjusts the voltage of the biasing end BN (e.g. to one of biasing voltages VB1, VB2, VB3, . . . etc.), to keep the voltage of the positive input end INP at a constant value. The non-ideal effects between the positive input end INP and the negative input end INN are eased, therefore.

Figure 4:
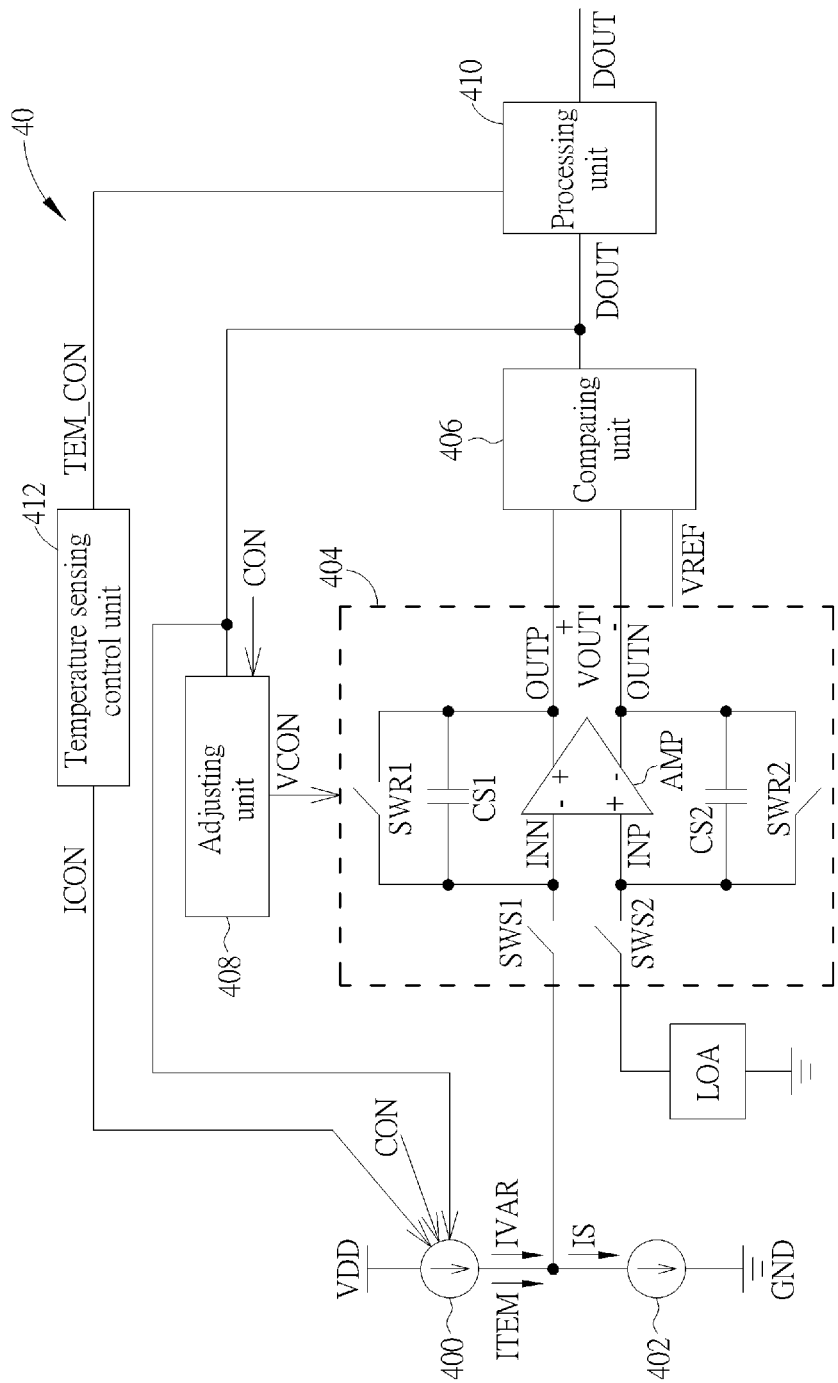
FIG. 4 is a schematic diagram of another analog-to-digital converting module according to an example of the present invention.

Please refer to FIG. 4, which is a schematic diagram of an analog-to-digital converting module 40 according to an example of the present invention. The analog-to-digital converting module 40 may be utilized in a light sensing device, and is not limited herein. The analog-to-digital converting module 40 is similar to the analog-to-digital converting module 10, thus the components and signals with similar functions use the same symbols. In this example, the measure current source 402 is the PTAT current source and the analog-to-digital converting module 40 further comprises a processing unit 410 and a temperature sensing control unit 412. The processing unit 410 may be a DSP and is utilized to generate temperature sensing control signal TEM_CON according to the digital output signal DOUT. According to the temperature sensing control signal TEM_CON, the temperature sensing control unit 412 controls the variable current source 400 to generate a temperature sensing calibration current ITEM to the negative input end INN, to eliminate the non-ideal effects of the measure current source 402. According to different applications and design concepts, the temperature sensing control unit 412 can be realized by various methods. In an example, the temperature sensing control unit 412 comprises a mapping table that stores mapping relationships between the digital output signal DOUT and current value of the temperature current ITEM. The temperature sensing control unit 412 decides the current value of the temperature sensing calibration current ITEM according to the table and the temperature sensing control signal TEM_CON related to the digital output signal DOUT.

Figure 5:
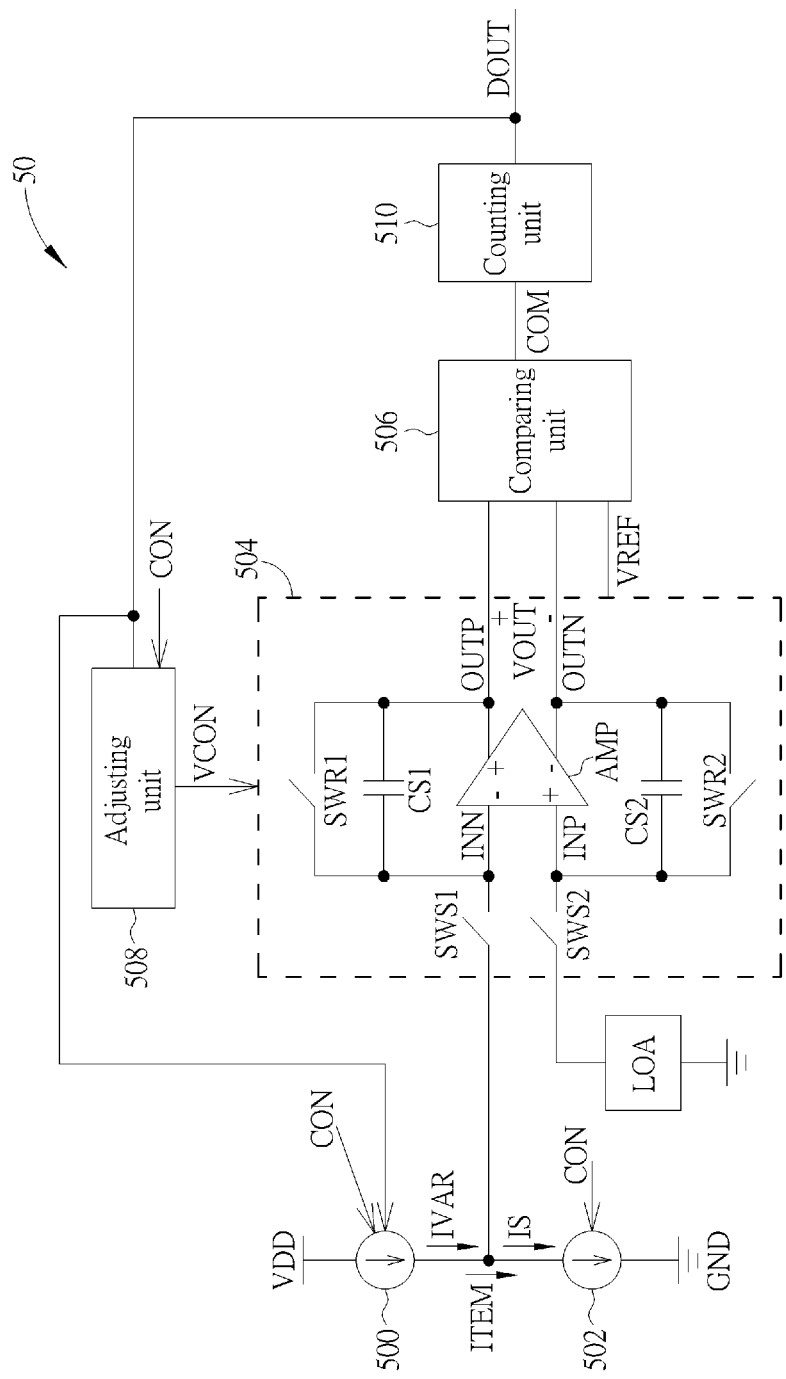
FIG. 5 is a schematic diagram of another analog-to-digital converting module according to an example of the present invention.

Please refer to FIG. 5, which is a schematic diagram of an analog-to-digital converting module 50 according to an example of the present invention. The analog-to-digital converting module 50 is similar to the analog-to-digital converting module 10 shown in FIG. 1, thus the components and signals with similar functions use the same symbols. The analog-to-digital converting module 50 adds a counting unit 510 coupled to the comparing unit 506. The counting unit 510 is utilized to generate the digital output signal DOUT according to the comparing signal COM outputted by the comparing unit 506.

As to the detailed operations of the analog-to-digital converting module 50 please refer to the followings. In a period TP3 of a constant time T_CH, the variable current source 500 stops generating the variable current IVAR to the negative input end INN according to the control signal CON and the measured current source 502 generates the measured current IS to the negative input end INN according to the control signal CON. The sampling unit 504 integrates the measured current IS generated by the measured current source 502, to make the output voltage VOUT increase from the reference voltage VREF to a voltage VA. In a subsequent period TP4, the measured current source 502 stops operating according to the control signal CON and the variable current source 500 generates the variable current IVAR to the negative input end INN. The sampling unit 504 integrates the variable current IVAR, to make the output voltage VOUT decrease from the voltage VA. The comparing unit 506 compares the output voltage VOUT and the reference voltage VREF, to generate the comparing signal COM. The counting unit 510 counts a time T_DIS of the output voltage VOUT decreasing from the voltage VA to the reference voltage VREF (i.e. the time of the output voltage VOUT becomes smaller than the reference voltage VREF in the period TP4) according to the comparing signal COM. According to the times T_CH, T_DIS and the current value of the variable current IVAR, the counting unit 510 is able to acquire the current value of the measured current IS and accordingly generates the digital output signal DOUT. As can be seen from the above, the operation principles of the analog-to-digital converting module 50 are similar to those of a dual slope analog-to-digital converter. Via adding the counting unit 510, the analog-to-digital converting module 50 is capable of adopting the converting method other than the cyclic analog-to-digital converting method and the successive approximation analog-to-digital converting method to convert the measured current IS.

Note that, the analog-to-digital converting module 50 may further comprise a current calibration unit (not shown in FIG. 5). The current calibration unit is utilized to control the variable current source 500 to generate a calibration current ICAL according to the digital output signal DOUT in the period TP3, to eliminate the non-ideal effect of the measure current source 502.

Figure 6:
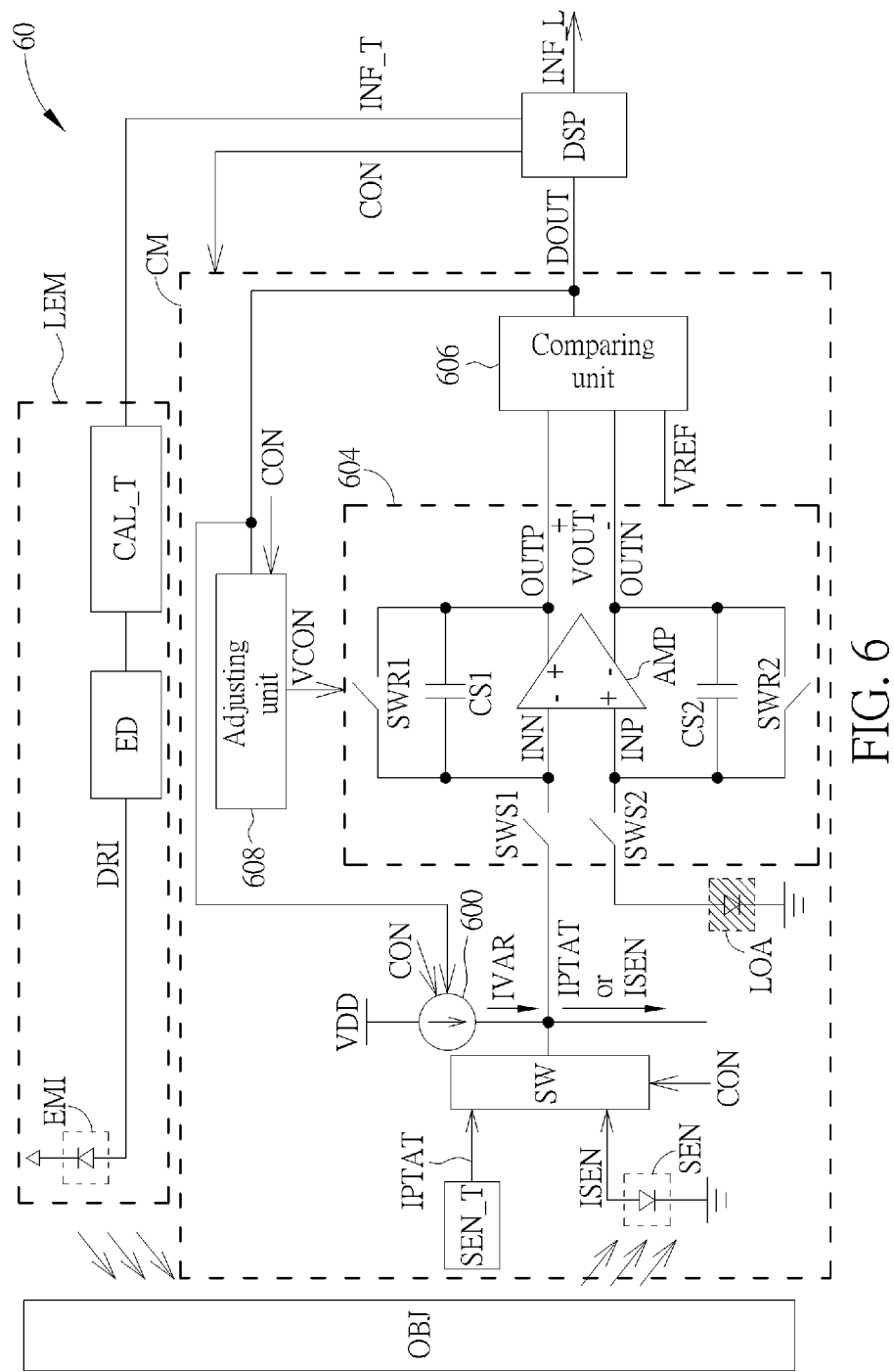
FIG. 6 is a schematic diagram of a sensing device according to an example of the present invention.

Please refer to FIG. 6, which is a schematic diagram of a sensing device 60 according to an example of the present invention. As shown in FIG. 6, the sensing device 60 comprises a light emitting module LEM, an analog-to-digital converting module CM, a switch unit SW, a sensing unit SEN, a temperature sensing unit SEN_T, and a processing unit DSP. The light emitting module LEM comprises a light emitter EMI, an emitting driver ED, and a temperature calibration unit CAL_T. The light emitter may be an electric component capable of emitting light of a specific frequency range, such as a light emitting diode (LED) or a laser diode (LD), and is not limited herein. The light emitter adjusts the intensity of the emitted light according to a light driving signal DRI generated by the emitting driver LD. The analog-to-digital converting module CM is similar to the analog-to-digital converting module 10 shown in FIG. 1, thus the components and signals with similar functions use the same symbols. In the example, the loading unit LOA coupled to the positive input end INP is realized by a photo diode that does not receive the ambient light. The sensing unit SEN is a photo diode and is utilized to sense light emitted by the light emitter EMI and reflected by an object, to generate a sensing current IS. The temperature sensing unit SEN_T is utilized to generate a temperature sensing current IPTAT that is proportional to the temperature difference between the ambient temperature and the absolute temperature. According to the control signal CON, the switch unit SW conducts a connection between the temperature sensing unit SEN_T and the negative input end INN of the analog-to-digital converting module CM in a period TP5 and conducts another connection between the sensing unit SEN and the negative input end INN of the analog-to-digital converting module CM in a period TP6. According to the control signal CON, the analog-to-digital converting module CM converts the temperature sensing current IPTAT to the digital output signal DOUT in the period TP5 and converts the sensing current ISEN to the digital output signal DOUT in the period TP6. In other words, the switch unit SW selects the sensing unit SEN or the temperature sensing unit SEN_T to be the measured current source 102 shown in FIG. 1. The processing unit DSP is utilized to generate the control signal CON. According to the digital output signal DOUT, the processing unit DSP generates the temperature information INF_T to the temperature calibration unit CAL_T or generates the light sensing information INF_L to post-stage computing circuits (e.g. a micro controller or a microprocessor). The temperature calibration unit CAL_T adjusts the light driving signal DRI generated by the emitting driver ED according to the temperature information INF_T, to achieve the function of adjusting the intensity of the light generated by the light emitter EMI according to the environment conditions. Because the sensing device 60 uses single analog-to-digital converting module CM to convert the sensing current ISEN and the temperature current IPTAT, the manufacture cost of the sensing device 60 is reduced.

As to detailed operations of the sensing device 60 please refer to the followings. In the period TP5, the processing unit DSP adjusts the control signal CON to make the switch unit SW conduct the connection between the temperature sensing unit SEN_T and the negative input end INN, to make the temperature sensing current IPTAT the measure current of the analog-to-digital converting module CM. The analog-to-digital converting module CM enters the successive approximation analog-to-digital converting mode to converts the temperature sensing current IPTAT to the digital output signal DOUT. The operations of the analog-to-digital converting module CM operating in the successive approximation converting mode can be referred to the above descriptions and are not narrated herein for brevity. According to the digital output signal DOUT generated by the analog-to-digital converting module CM operating in the successive approximation analog-to-digital converting mode, the process unit DSP generates the temperature sensing information INF_T indicating the ambient temperature to the temperature calibration unit CAL_T. In an example, the temperature calibration unit CAL_T stores the mapping table of the relationships between the ambient temperature and the magnitude of the light driving signal DRI (e.g. the current value of the light driving signal DRI). After receiving the temperature sensing information INF_T, the temperature calibration unit CAL_T adjusts the magnitude of the light driving signal DRI (i.e. the intensity of the light emitted by the light emitter EMI) according to the ambient temperature.

In the period TP6, the processing unit DSP adjusts the control signal CON to control the switch unit SW to conduct the connection between the sensing unit SEN and the negative input end INN, to make the sensing current ISEN the measured current of the analog-to-digital converting module CM. The analog-to-digital converting module CM enters the cyclic analog-to-digital converting mode to convert the sensing current ISEN to the digital output signal DOUT. The operations of the analog-to-digital converting module CM operating in the cyclic analog-to-digital converting mode can be referred to the above descriptions and are not narrated herein for brevity. According to the digital output signal DOUT generated by the analog-to-digital converting module CM operating in the cyclic analog-to-digital converting mode, the process unit DSP generates the light sensing information INF_L to the post-stage computing circuits.

The analog-to-digital converting modules of the above examples use the same components to realize different converting modes. Under such a condition, the analog-to-digital converting module is able to select appropriate converting mode to convert the measured signal according to the type of the measure signal and the required output specifications. As a result, the number of the analog-to-digital converting modules for realizing the sensing device decreases and the manufacture cost of the sensing device is further reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An analog-to-digital module, comprising:
    a sampling unit, for generating an output voltage between a positive output end and a negative output end according to a positive input voltage of a positive input end and a negative input voltage of a negative input end;
    a comparing unit, for generating a digital output signal according to magnitude relationship between the output voltage and a reference voltage;
    a variable current source, for generating a variable current according to the digital output signal at the negative input end in a first period according to a control signal;
    a measured current source, for generating a measured current at the negative input end; and
    an adjusting unit, for adjusting the output voltage according to the digital output signal in a second period according to the control signal;
    wherein the first period does not overlap the second period.

2. The analog-to-digital converting module of claim 1, wherein the analog-to-digital converting module is a successive approximation register analog-to-digital converter in the first period.

3. The analog-to-digital converting module of claim 1, the analog-to-digital converting module is a cyclic analog-to-digital converter in the second period.

4. The analog-to-digital converting module of claim 1, further comprising:
    a processing unit, for generating a current calibration signal according to the digital output signal; and
    a current calibration unit, for generating a current control signal according to the current calibration signal to control the variable current source to generate a calibration current to the negative input end.

5. The analog-to-digital converting module of claim 4, the current calibration unit generates the current control signal according to the current calibration signal by a look-up table.

6. The analog-to-digital converting module of claim 1, further comprising:
    a loading unit, coupled to the positive input end.

7. The analog-to-digital converting module of claim 6, further comprising:
    a processing unit, for generating a loading calibration signal according to the digital output signal; and
    a loading calibration unit, for generating a loading control signal according to the loading calibration signal to adjust a loading of the loading unit.

8. The analog-to-digital converting module of claim 1, wherein in a third period, the measured current source generates the measured current and the variable current source stops generating the variable current according to the control signal, to make the output voltage increase from the reference voltage; in a fourth period subsequent to the third period, the measured current source stops generating the measured current and the variable current source generates the variable current according to the control signal, to make the output voltage decrease; and the analog-to-digital converting module further comprises:
    a counting unit, coupled to the comparing unit for counting the time of the output voltage becomes smaller than the reference voltage in the fourth period, to generate the digital output signal.

9. A sensing device, comprising:
    a light emitting module, for generate light of a predefined frequency range according to temperature sensing information;
    an analog-to-digital converting module, comprising:

a sampling unit, for generating an output voltage between a positive output end and a negative output end according to a positive input voltage of a positive input end and a negative input voltage of a negative input end;

a comparing unit, for generating a digital output signal according to magnitude relationship between the output voltage and a reference voltage;

a variable current source, for generating a variable current according to the digital output signal at the negative input end in a first period according to a control signal;

an adjusting unit, for adjusting the output voltage according to the digital output signal in a second period according to the control signal;

a sensing unit, for sensing the light of the predefined frequency range to generate a sensing current;

a temperature sensing unit, for generating a temperature sensing current proportional to the absolute temperature; and a switch unit, for conducting a connection between the temperature sensing unit and the negative input end in the first period and conducting another connection between the sensing unit and the negative input end in the second period; and a process unit, for generating the control signal, generating the temperature sensing information according to the digital output signal in the first period, and generating a light sensing information according to the digital output signal in the second period;

wherein the first period does not overlap the second period.

10. The sensing device of claim 9, wherein the analog-to-digital converting module is a successive approximation register analog-to-digital converter in the first period.

11. The sensing device of claim 9, the analog-to-digital converting module is a cyclic analog-to-digital converter in the second period.

12. The sensing device of claim 9, further comprising:
a processing unit, for generating a current calibration signal according to the digital output signal; and
a current calibration unit, for generating a current control signal according to the current calibration signal to control the variable current source to generate a calibration current to the negative input end.

13. The sensing device of claim 12, the current calibration unit generates the current control signal according to the current calibration signal by a look-up table.

14. The sensing device of claim 9, further comprising:
a loading unit, coupled to the positive input end.

15. The sensing device of claim 14, further comprising:
a processing unit, for generating a loading calibration signal according to the digital output signal; and
a loading calibration unit, for generating a loading control signal according to the loading calibration signal to adjust a loading of the loading unit.

16. The sensing device of claim 9, wherein in a third period, the measured current source generates the measured current and the variable current source stops generating the variable current according to the control signal, to make the output voltage increase from the reference voltage; in a fourth period subsequent to the third period, the measured current source stops generating the measured current and the variable current source generates the variable current according to the control signal, to make the output voltage decrease; and the analog-to-digital converting module further comprises:
a counting unit, coupled to the comparing unit for counting the time of the output voltage becomes smaller than the reference voltage in the fourth period, to generate the digital output signal.

* * * * *